United States Patent
Zhu et al.

(10) Patent No.: US 10,705,388 B2
(45) Date of Patent: Jul. 7, 2020

(54) DISPLAY PANEL AND METHOD FOR PRODUCING THE SAME AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Jinming Zhu, Beijing (CN); Hui Wang, Beijing (CN); Jia Liu, Beijing (CN); Yuanhui Guo, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 109 days.

(21) Appl. No.: 15/761,792

(22) PCT Filed: Aug. 1, 2017

(86) PCT No.: PCT/CN2017/095407
§ 371 (c)(1),
(2) Date: Mar. 20, 2018

(87) PCT Pub. No.: WO2018/133372
PCT Pub. Date: Jul. 26, 2018

(65) Prior Publication Data
US 2019/0064571 A1    Feb. 28, 2019

(30) Foreign Application Priority Data
Jan. 20, 2017  (CN) .......................... 2017 1 0042413

(51) Int. Cl.
*G02F 1/1339* (2006.01)
*G02F 1/1333* (2006.01)
(Continued)

(52) U.S. Cl.
CPC .... *G02F 1/13394* (2013.01); *G02F 1/133371* (2013.01); *G02F 1/1368* (2013.01);
(Continued)

(58) Field of Classification Search
CPC ................. G02F 1/133371; G02F 2001/13396
See application file for complete search history.

(56) References Cited

U.S. PATENT DOCUMENTS

2004/0201815 A1* 10/2004 Yamamoto ........ G02F 1/133371
                                                       349/156
2007/0177072 A1*  8/2007 Chang ................. G02F 1/13394
                                                       349/110
(Continued)

FOREIGN PATENT DOCUMENTS

CN    103728788 A    4/2014
CN    103869560 A    6/2014
(Continued)

OTHER PUBLICATIONS

International Search Report & Written Opinion, for PCT Patent Application No. PCT/CN2017/095407, dated Oct. 18, 2017, 11 pages.

*Primary Examiner* — Alexander P Gross
(74) *Attorney, Agent, or Firm* — Kinney & Lange, P.A.

(57) ABSTRACT

The embodiments of the present disclosure provide a display panel, a method for producing the same and a display apparatus. The display panel includes a first sub-pixel region; a second sub-pixel region, wherein an aperture opening ratio of the first sub-pixel region is less than an aperture opening ratio of the second sub-pixel region; and an (Continued)

insulation layer, having a first thickness at the first sub-pixel region less than a second thickness of the insulation layer at the second sub-pixel region, so that a first cell gap of the display panel at the first sub-pixel region is larger than a second cell gap of the display panel at the second sub-pixel region, thereby at least partially compensating for a difference between the aperture opening ratio of the first sub-pixel region and the aperture opening ratio of the second sub-pixel region.

4 Claims, 2 Drawing Sheets

(51) Int. Cl.
    *G02F 1/1368*     (2006.01)
    *G02F 1/1335*     (2006.01)
    *H01L 27/12*     (2006.01)
    *G02F 1/1362*     (2006.01)

(52) U.S. Cl.
    CPC .................. *G02F 1/133514* (2013.01); *G02F 2001/13396* (2013.01); *G02F 2001/133357* (2013.01); *G02F 2001/136236* (2013.01); *G02F 2201/40* (2013.01); *H01L 27/1248* (2013.01)

(56) References Cited

U.S. PATENT DOCUMENTS

| | | | |
|---|---|---|---|
| 2007/0216847 A1 | 9/2007 | Chang et al. | |
| 2009/0273747 A1* | 11/2009 | Shin ................... | G02F 1/13394 349/107 |
| 2010/0066952 A1* | 3/2010 | Tsuchiya ........... | G02F 1/133514 349/106 |
| 2014/0168583 A1 | 6/2014 | Hu et al. | |
| 2015/0070624 A1* | 3/2015 | Liu ................... | G02F 1/133514 349/61 |
| 2015/0268504 A1 | 9/2015 | Kobayashi et al. | |
| 2016/0062169 A1* | 3/2016 | Park ................. | G02F 1/133514 349/44 |

FOREIGN PATENT DOCUMENTS

| | | |
|---|---|---|
| CN | 104049418 A | 9/2014 |
| CN | 105676547 A | 6/2016 |
| CN | 106773356 A | 5/2017 |

\* cited by examiner

DISPLAY PANEL AND METHOD FOR PRODUCING THE SAME AND DISPLAY APPARATUS

CROSS-REFERENCE TO RELATED APPLICATION

This application is the national phase of PCT Application No. PCT/CN2017/095407 filed Aug. 1, 2017, which in turn claims priority of the Chinese Patent Application No. 201710042413.X entitled "A Display Panel and Method for Producing The Same and Display Apparatus", filed with the State Intellectual Property Office of China on Jan. 20, 2017, which is incorporated herein by reference in its entirety.

BACKGROUND OF THE DISCLOSURE

Field of the Disclosure

The present disclosure relates to the technical field of display, and in particular, to a display panel, a method for the display panel and a display apparatus.

Description of the Related Art

Thin film transistor liquid crystal display (abbreviated as TFT-LCD) has advantages such as small volume, low power consumption, no radiation or the like. Recently, such TFT-LCD has developed rapidly and has dominated the market. The TFT-LCD is a precise and complex device which consists of a plurality of components. It mainly includes the following three parts, a color filter glass (abbreviated as CF) substrate, a TFT glass (abbreviated as TFT) substrate, and a liquid crystal layer between the two substrates. When assembling the two substrates, the liquid crystal is dipped onto one of the substrates, and a sealant in which silicon spheres having a predetermined size with a certain ratio are incorporated, is coated on the other substrate. Finally, a liquid crystal display panel is completed by a vacuum assembling process and a curing process of the sealant.

SUMMARY

Embodiments of the present disclosure provide a display panel, a method for producing the display panel, and a display apparatus.

In accordance with one aspect of the present disclosure, it provides a display panel, comprising:
a first sub-pixel region;
a second sub-pixel region, wherein an aperture opening ratio of the first sub-pixel region is less than an aperture opening ratio of the second sub-pixel region; and
an insulation layer, having a first thickness in the first sub-pixel region less than a second thickness of the insulation layer in the second sub-pixel region, so that a first cell gap of the display panel at the first sub-pixel region is larger than a second cell gap of the display panel at the second sub-pixel region, thereby at least partially compensating difference between the aperture opening ratio of the first sub-pixel region and the aperture opening ratio of the second sub-pixel region.

In one example, the display panel further comprising a photo spacer provided within the first sub-pixel region.

In one example, the display panel further comprising:
a main photo spacer provided at the first sub-pixel region; and
an auxiliary photo spacer correspondingly provided at the second sub-pixel region;
wherein an area which the main photo spacer occupies in the first sub-pixel region is larger than an area which the auxiliary photo spacer occupies in the second sub-pixel region.

In one example, the display panel further comprising a third sub-pixel region which has an aperture opening ratio larger than the aperture opening ratio of the second sub-pixel region;
the second thickness of the insulation layer in the second sub-pixel region is less than a third thickness of the insulation layer in the third sub-pixel region, so that the second cell gap of the display panel at the second sub-pixel region is larger than a third cell gap of the display panel at the third sub-pixel region, thereby at least partially compensating difference between the aperture opening ratio of the second sub-pixel region and the aperture opening ratio of the third sub-pixel region.

In one example, the photo spacer is provided on a base substrate of a color filter substrate and the insulation layer is provided on a base substrate of an array substrate.

In one example, the photo spacer is provided on a base substrate of an array substrate, and the insulation layer is provided on a base substrate of a color filter substrate.

In one example, the photo spacer and the insulation layer both are provided on a base substrate of an array substrate; or the photo spacer and the insulation layer both are provided on a base substrate of a color filter substrate.

In one example, the main photo spacer and the auxiliary photo spacer are provided on a base substrate of a color filter substrate, and the insulation layer is provided on a base substrate of an array substrate.

In one example, the main photo spacer and the auxiliary photo spacer are provided on a base substrate of an array substrate, and the insulation layer is provided on a base substrate of a color filter substrate.

In one example, the main photo spacer, the auxiliary photo spacer and the insulation layer all are provided on a base substrate of an array substrate; or the main photo spacer, the auxiliary photo spacer and the insulation layer all are provided on a base substrate of a color filter substrate.

In one example, the first cell gap of the first sub-pixel region and the second cell gap of the second sub-pixel region are configured such that the difference between the aperture opening ratio of the first sub-pixel region and the aperture opening ratio of the second sub-pixel region is eliminated.

In one example, the second cell gap of the second sub-pixel region and the third cell gap of the third sub-pixel region are configured such that the difference between the aperture opening ratio of the second sub-pixel region and the aperture opening ratio of the third sub-pixel region is eliminated.

In one example, the insulation layer consists of one single layer or more than one layers.

In one example, the insulation layer is a passivation layer provided on a base substrate of an array substrate.

In one example, the insulation layer is the passivation layer provided on the base substrate of the array substrate adjacent to a base substrate of a color filter substrate.

In one example, the insulation layer is composed of an organic insulation layer and a passivation layer provided on a base substrate of an array substrate.

In one example, the insulation layer is composed of the organic insulation layer and the passivation layer provided on the base substrate of the array substrate adjacent to a base substrate of a color filter substrate.

In one example, the insulation layer is a planarization layer provided on a base substrate of a color filter substrate.

In accordance with another aspect of the present disclosure, it provides a display apparatus, comprising the display panel as claimed in the above aspect or examples.

In accordance with a further aspect of the present disclosure, it provides a method for producing the display panel as described above, comprising:

forming the first sub-pixel region and the second sub-pixel region, so that the aperture opening ratio of the first sub-pixel region is less than the aperture opening ratio of the second sub-pixel region;

forming a pattern of the insulation layer by one patterning process, wherein the insulation layer has the first thickness in the first sub-pixel region less than the second thickness of the insulation layer in the second sub-pixel region, so that the first cell gap of the display panel at the first sub-pixel region is larger than the second cell gap of the display panel at the second sub-pixel region, thereby at least partially compensating difference between the aperture opening ratio of the first sub-pixel region and the aperture opening ratio of the second sub-pixel region.

DETAILED DESCRIPTION OF PREFERRED EMBODIMENTS OF THE DISCLOSURE

In order to enable the skilled person in the art to better understand technical solutions of the present disclosure, a display panel, a method for producing the display panel and a display apparatus provided by the present disclosure will be described in detail with reference to the accompanying drawings in combination with the specific embodiments.

In order to ensure thickness uniformity of a cell of the liquid crystal display panel, it is necessary to design a lot of photo spacers within the cell of the liquid crystal display panel. Typically, a plurality of discrete photo spacers (abbreviated as PS) are formed on a CF substrate in an active area (abbreviated as AA) of the display panel through an exposure process. Such photo spacers are classified into main photo spacers and auxiliary photo spacers. The main photo spacer has a relatively large cross sectional area, while the auxiliary photo spacer has a relatively small cross sectional area. With such arrangement, an aperture opening ratio of a pixel region where the main photo spacer is located is smaller than that of a pixel region where auxiliary photo spacers at a periphery of the same main photo spacer are located. The final indication in terms of display performance of the display panel is that display brightness of the pixel region where the main photo spacer is located is less than that of the pixel region where the auxiliary photo spacers thereof are located. Herein the term "aperture opening ratio" is referred to a ratio of an area capable of passing the light rays in each sub-pixel to an entire area of the each sub-pixel.

Figure 1:
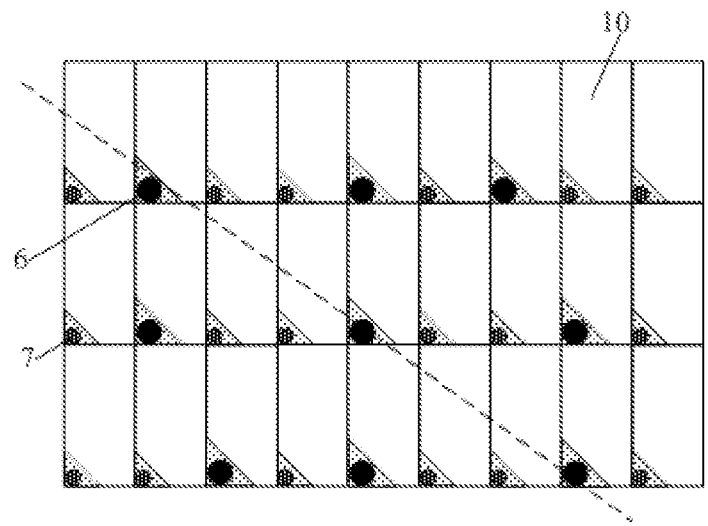
FIG. 1 is a top view for showing distribution of main photo spacers and auxiliary photo spacers on a liquid crystal display panel.

As shown in FIG. 1, the main photo spacers 6 are uniformly distributed within the display panel, which is a schematic view for showing typical design arrangement of the main photo spacers 6 having a density of $1/18$. When observing under the entire view, a plurality of mura (shown by the dash lines in the figure) are formed since the brightness of the pixel regions 10 where the main photo spacers 6 are located is less than that of the pixel regions 10 where all the auxiliary photo spacers 7 are located, thereby adversely degrading the display effect of the picture.

Therefore, the inventor of the present disclosure has found that it is necessary to at least partially alleviate or eliminate the mura present upon the display panel is displaying, thereby improving the uniformity of the displaying brightness thereof.

Figure 2:
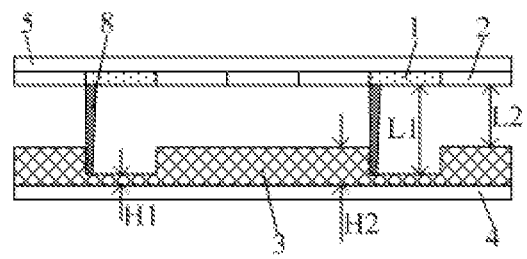
FIG. 2 is a schematic cross sectional view for showing a structure of a display panel in accordance with one embodiment of the present disclosure.
Figure 3:
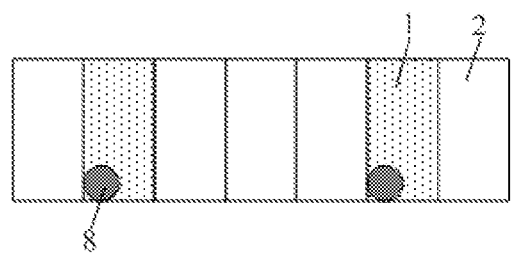
FIG. 3 is a schematic top view for showing distribution of photo spacers shown in FIG. 2 in a sub-pixel region.

One embodiment of the present disclosure provides a display panel as shown in FIGS. 2 and 3, which includes a first sub-pixel region 1 and a second sub-pixel region 2. The first sub-pixel region 1 has an aperture opening ratio less than that of the second sub-pixel region 2. The display panel further includes an insulation layer 3, which has a first thickness H1 in the first sub-pixel region 1 less than a second thickness H2 in the second sub-pixel region 2. In order that difference between the aperture opening ratio of the first sub-pixel region 1 and the aperture opening ratio of the second sub-pixel region 2 is least partially compensated, it may make a first cell gap L1 of the display panel at the first sub-pixel region 1 be larger than a second cell gap L2 of the display panel at the second sub-pixel region 2. In some embodiments, the difference between the aperture opening ratio of the first sub-pixel region 1 and the aperture opening ratio of the second sub-pixel region 2 is substantially or completely eliminated.

The display panel herein is referred to a liquid crystal display panel. The cell thickness of the display panel has a positive correlation with liquid crystal light efficiency (i.e., a transitivity of light passing through a liquid crystal layer in the display panel) when it displays, i.e., a positive proportion. Due to this, the first thickness H1 of the insulation layer 3 in the first sub-pixel region 1 is provided to be less than the second thickness H2 of the insulation layer 3 in the second sub-pixel region 2, so that the first cell gap L1 of the display panel at the first sub-pixel region 1 is larger than the second cell gap L2 of the display panel at the second sub-pixel region 2, and then the liquid crystal light efficiency of the display panel at the first sub-pixel region 1 is larger than that of the display panel at the second sub-pixel region 2. In this way, a difference between the liquid crystal light efficiencies of the display panel at the first and second sub-pixel regions 1 and 2 can compensate the difference between the aperture opening ratio of the first sub-pixel region 1 and the aperture opening ratio of the second sub-pixel region 2, thereby improving difference of transitivity of lights passing through the first and second sub-pixel regions 1 and 2 of the display panel. Finally, it can enable the light transitivity of the display panel more uniform, alleviate the mura phenomena present when the display panel is displaying, and improve the displaying effect of the picture.

Please be noted that the above embodiment of the present disclosure takes one pixel unit including one first sub-pixel region and one second sub-pixel region as one example for illustration. Of course, the skilled person in the art can appropriately adapt and modify them on a basis of the concept of the present disclosure as required, for example, it is possible to adjust the first and/or second sub-pixel regions in one pixel unit so as to have the aperture opening ratio being matched to that of the first and/or second sub-pixel regions in another pixel unit. The present disclosure does not repeat them in detail herein.

In the present embodiment, the display panel further includes a photo spacer 8 provided in the first sub-pixel region 1 whereas the photo spacer 8 is not provided in the second sub-pixel region 2.

In the present embodiment, the photo spacer 8 is provided on a base substrate 5 of a CF substrate, and extends towards a base substrate 4 of an array substrate. The insulation layer 3 is arranged on the base substrate 4 of the array substrate.

The photo spacer 8 is located in an area corresponding to the area where the black matrix is located within the first sub-pixel region 1. Since the photo spacer 8 occupies a portion of the area of the first sub-pixel region 1, the aperture opening ratio of the first sub-pixel region 1 is less than that of the second sub-pixel region 2. The first thickness H1 of the insulation layer 3 in the first sub-pixel region 1 is provided to be less than the second thickness H2 of the insulation layer 3 in the second sub-pixel region 2, so that the first cell gap L1 of the display panel at the first sub-pixel region 1 is larger than the second cell gap L2 of the display panel at the second sub-pixel region 2, and then the liquid crystal light efficiency of the display panel at the first sub-pixel region 1 is larger than that of the display panel at the second sub-pixel region 2. In this way, a difference between the liquid crystal light efficiencies of the display panel at the first sub-pixel region 1 and the second sub-pixel region 2 can compensate the difference between the aperture opening ratio of the first sub-pixel region 1 and the aperture opening ratio of the second sub-pixel region 2, thereby improving difference of transitivity of lights passing through the first and second sub-pixel regions 1 and 2 of the display panel. Finally, it can enable the light transitivity of the display panel more uniform, alleviate the mura phenomena present when the display panel is displaying, and improve the displaying effect of the picture.

It should be noted that the base substrate 5 of the CF substrate is also provided with other film layers, such as a black matrix, a color filter and a planarization layer and the like. They are not repeated herein in detail.

In the present embodiment, the first cell gap at the first sub-pixel region 1 and the second cell gap at the second sub-pixel region 2 of the display panel are different from each other, so that the difference between the aperture opening ratio of the second sub-pixel region 2 and the aperture opening ratio of the first sub-pixel region 1 is at least partially compensated. In some embodiments, the difference between the aperture opening ratio of the first sub-pixel region 1 and the aperture opening ratio of the second sub-pixel region 2 is substantially or completely eliminated. With such arrangement, the difference between the aperture opening ratio of the first sub-pixel region 1 and the aperture opening ratio of the second sub-pixel region 2 caused by the photo spacer can just be compensated by the difference between the first cell gap of the first sub-pixel region 1 and the second cell gap of the second sub-pixel region 2, so that the light transitivity of the second sub-pixel region 2 is same to that of the first sub-pixel region 1. Further, it can enable the light transitivity of the display panel more uniform, completely eliminate the mura phenomena present when the display panel is displaying, and improve the displaying effect of the picture.

In the present embodiment, the insulation layer 3 includes one single layer. The display panel further includes a gate electrode, a gate insulation layer, an active layer, a source electrode and a drain electrode, a passivation layer and a pixel electrode subsequently arranged on the base substrate 4 of the array substrate, that is, the display panel is of TN (Twisted Nematic) display mode. The insulation layer 3 includes a passivation layer provided on the base substrate 4 of the array substrate. The insulation layer 3 is a passivation layer provided on the base substrate 4 of the array substrate adjacent to the base substrate 5 of the CF substrate, which can make the insulation layer 3 easily form respective local parts with different thicknesses at the first and second sub-pixel regions 1 and 2, i.e., a step of thickness is formed within the insulation layer 3; because no more insulation layers will be provided on the passivation layer at the side facing away the base substrate 4 of the array substrate, the step of thickness formed on this passivation layer would not be easily covered by other insulation film or layer thereon, thereby preventing other insulation film or layer from eliminating the step of thickness formed on the passivation layer.

Please be noted that the insulation layer can also include several layers. For example, the display panel can also include a gate electrode, a gate insulation layer, an active layer, a source electrode and a drain electrode, a common electrode, an organic insulation layer, a passivation layer and a pixel electrode subsequently arranged on the base substrate of the array substrate, that is, the display panel is of ADS (Advanced Super Dimension Switch) display mode. The insulation layer consists of the organic insulation layer and the passivation layer provided on the base substrate of the array substrate. In other words, the insulation layer consists of the passivation layer and the organic insulation layer provided on the base substrate of the array substrate adjacent to the base substrate of the CF substrate, which can not only make the insulation layer easily form respective local parts with different thicknesses at the first and second sub-pixel regions, i.e., a step of thickness is formed within the insulation layer, the step of thickness formed on this passivation layer and the organic insulation layer would not be easily covered by other insulation film or layer thereon, thereby preventing other insulation film or layer from eliminating the step of thickness formed on the passivation layer and the organic insulation layer; but also the step of thickness is formed within the two layers at the same time, so that difference between the first cell gap of the first sub-pixel region and the second cell gap of the second sub-pixel region of the display panel can be adjusted within a larger range, and then the difference between the aperture opening ratio of the first sub-pixel region and the aperture opening ratio of the second sub-pixel region can be better compensated by adjusting the difference between the first cell gap of the first sub-pixel region and the second cell gap of the second sub-pixel region. In this example, other films or layers such as TFTs, pixel electrodes and common electrodes can be provided on the base substrate of the array substrate, which will not be described repeatedly herein.

On the basis of the above described structures of the display panel in the present embodiment, the embodiment also provides a method for producing such display panel. The method includes: forming a first sub-pixel region and a second sub-pixel region wherein an aperture opening ratio of the first sub-pixel region is less than that of the second sub-pixel region; forming a pattern of an insulation layer by one patterning process, wherein a first thickness of the insulation layer in the first sub-pixel region is less than a second thickness of the insulation layer in the second sub-pixel region so that a first cell gap of the display panel at the first sub-pixel region is larger than a second cell gap of the display panel at the second sub-pixel region, and the difference between the aperture opening ratio of the first sub-pixel region and the aperture opening ratio of the second sub-pixel region is substantially or completely eliminated. In one example, the pattern of the insulation layer is formed by a half tone mask process.

In one example, when the insulation layer consists of one layer, the method for producing the display panel further includes a step of forming a pattern of the passivation layer on the base substrate of the array substrate by using the patterning process, in which the pattern of the passivation layer is formed by a half tone mask process. The first thickness of the passivation layer in the first sub-pixel region is less than the second thickness of the passivation layer in the second sub-pixel region.

It should be noted that when the insulation layer consists of more than one layers, the method for producing the display panel further includes a step of forming a pattern of an organic insulation layer and a pattern of a passivation layer subsequently on the base substrate of the array substrate by using the patterning process, in which the pattern of the organic insulation layer and the pattern of the passivation layer are formed by a half tone mask process. The first thickness of the organic insulation layer and the passivation layer in the first sub-pixel region is less than the second thickness of the organic insulation layer and the passivation layer in the second sub-pixel region.

In the method for producing the display panel, the manufacturing of the insulation layer would not result in increase of the complexity of the process and the production cost, and thus has good applicability. In this way, the manufacturing of the display panel would not cause increase of the complexity of the process and the production cost.

Figure 4:
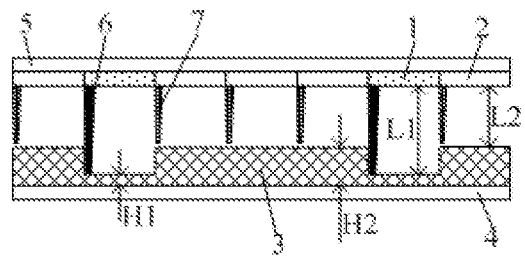
FIG. 4 is a schematic cross sectional view for showing a structure of a display panel in accordance with another embodiment of the present disclosure.
Figure 5:
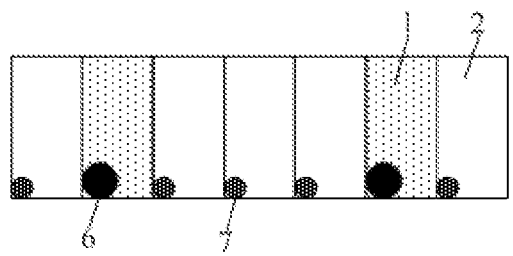
FIG. 5 is a schematic top view for showing distribution of main photo spacers and auxiliary spacers shown in FIG. 4 in a sub-pixel region.

Another embodiment of the present disclosure provides a display panel, as shown in FIGS. 4 and 5, including a first sub-pixel region 1 and a second sub-pixel region 2. The aperture opening ratio of the first sub-pixel region 1 is less than that of the second sub-pixel region 2. The display panel further includes an insulation layer 3, which has a first thickness H1 in the first sub-pixel region 1 less than a second thickness H2 in the second sub-pixel region 2. In order that the difference between the aperture opening ratio of the first sub-pixel region 1 and the aperture opening ratio of the second sub-pixel region 2 is at least partially compensated, it shall make a first cell gap L1 of the display panel at the first sub-pixel region 1 larger than a second cell gap L2 of the display panel at the second sub-pixel region 2. In some embodiments, the difference between the aperture opening ratio of the first sub-pixel region 1 and the aperture opening ratio of the second sub-pixel region 2 is substantially or completely eliminated.

The display panel herein is referred to a liquid crystal display panel. The cell thickness of the display panel has a positive correlation with liquid crystal light efficiency when it displays, i.e., a positive proportion. Due to this, the first thickness H1 of the insulation layer 3 at the first sub-pixel region 1 is provided to be less than the second thickness H2 of the insulation layer 3 at the second sub-pixel region 2, so that the first cell gap L1 of the display panel at the first sub-pixel region 1 is larger than the second cell gap L2 of the display panel at the second sub-pixel region 2, and then the liquid crystal light efficiency of the display panel at the first sub-pixel region 1 is larger than that of the display panel at the second sub-pixel region 2. In this way, a difference between the liquid crystal light efficiencies of the display panel at the first sub-pixel region 1 and the second sub-pixel region 2 can compensate the difference between the aperture opening ratio at the first sub-pixel region 1 and the aperture opening ratio of the second sub-pixel region 2, thereby improving difference of transitivity of lights passing through the first sub-pixel region 1 and the second sub-pixel region 2 of the display panel. Finally, it can enable the light transitivity of the display panel more uniform, improve the mura phenomena present when the display panel is displaying a picture, and improve the displaying effect of the picture.

In the present embodiment, the display panel further includes a main photo spacer 6 arranged in the first sub-pixel region 1 and an auxiliary photo spacer 7 arranged in the second sub-pixel region 2; the main photo spacer 6 occupies an area in the first sub-pixel region 1 larger than that which the auxiliary photo spacer 7 occupies in the second sub-pixel region 2.

In the present embodiment, the main photo spacer 6 and the auxiliary photo spacer 7 are provided on the base substrate 5 of the CF substrate, and extend towards the base substrate 4 of the array substrate. The insulation layer 3 is provided on the base substrate 4 of the array substrate.

The main photo spacer 6 is located in an area corresponding to the area where the black matrix is located within the first sub-pixel region 1, and the auxiliary photo spacer 7 is located in an area corresponding to the area where the black matrix is located within the second sub-pixel region 2. Since the main photo spacer 6 occupies an area larger than that which the auxiliary photo spacer 7 occupies, the aperture opening ratio of the first sub-pixel region 1 is less than that of the second sub-pixel region 2. The first thickness H1 of the insulation layer 3 at the first sub-pixel region 1 is provided to be less than the second thickness H2 of the insulation layer 3 at the second sub-pixel region 2, so that the first cell gap L1 of the display panel at the first sub-pixel region 1 is larger than the second cell gap L2 of the display panel at the second sub-pixel region 2, and then the liquid crystal light efficiency of the display panel at the first sub-pixel region 1 is larger than that of the display panel at the second sub-pixel region 2. In this way, a difference between the liquid crystal light efficiencies of the display panel at the first and second sub-pixel regions 1 and 2 can compensate the difference between the aperture opening ratio of the first sub-pixel region 1 and the aperture opening ratio of the second sub-pixel region 2, thereby improving difference of transitivity of lights passing through the first sub-pixel region 1 and the second sub-pixel region 2 of the display panel. Finally, it can enable the light transitivity of the display panel more uniform, and improve the displaying effect of the picture.

It should be noted that the base substrate 5 of the CF substrate is also provided with other film layers, such as the black matrix, the color filter and the planarization layer and the like. They will not be described repeatedly herein in detail.

In the present embodiment, the first cell gap at the first sub-pixel region 1 and the second cell gap of the second sub-pixel region 2 of the display panel are different from each other, so that the difference between the aperture opening ratio of the second sub-pixel region 2 and the aperture opening ratio of the first sub-pixel region 1 is substantially or completely eliminated. With such arrangement, the difference between the aperture opening ratio of the first sub-pixel region 1 and the aperture opening ratio of the second sub-pixel region 2 can just be compensated by the difference between the first cell gap of the first sub-pixel region 1 and the second cell gap of the second sub-pixel region 2, so that the light transitivity of the second sub-pixel region 2 is same to that of the first sub-pixel region 1. Further, it can enable the light transitivity of the display panel more uniform, completely eliminate the mura phenomena present when the display panel is displaying a picture, and improve the displaying effect of the picture.

In the present embodiment, the insulation layer 3 includes one single layer. The display panel further includes a gate electrode, a gate insulation layer, an active layer, a source electrode and a drain electrode, a passivation layer and a pixel electrode subsequently arranged on the base substrate 4 of the array substrate, that is, the display panel is of TN (Twisted Nematic) display mode. The insulation layer 3 includes a passivation layer provided on the base substrate 4 of the array substrate. The insulation layer 3 is a passivation layer provided on the base substrate 4 of the array substrate adjacent to the base substrate 5 of the CF substrate, which can make the insulation layer 3 easily form respective local parts with different thicknesses at the first and second sub-pixel regions 1 and 2, i.e., a step of thickness is formed within the insulation layer 3; because no more insulation layers will be provided on the passivation layer at the side facing away the base substrate 4 of the array substrate, the step of thickness formed on this passivation layer would not be easily covered by other insulation film or layer thereon, thereby preventing other insulation film or layer from eliminating the step of thickness formed on the passivation layer.

Please be noted that the insulation layer can also include several layers. For example, the display panel can also include a gate electrode, a gate insulation layer, an active layer, a source electrode and a drain electrode, a common electrode, an organic insulation layer, a passivation layer and a pixel electrode subsequently arranged on the base substrate of the array substrate, that is, the display panel is of ADS (Advanced Super Dimension Switch) display mode. The insulation layer consists of the organic insulation layer and the passivation layer provided on the base substrate of the array substrate. In other words, the insulation layer consists of the passivation layer and the organic insulation layer provided on the base substrate of the array substrate adjacent to the base substrate of the CF substrate, which can not only make the insulation layer easily form respective local parts with different thicknesses at the first and second sub-pixel regions, i.e., a step of thickness is formed within the insulation layer, the step of thickness formed on this passivation layer and the organic insulation layer would not be easily covered by other insulation film or layer thereon, thereby preventing other insulation film or layer from eliminating the step of thickness formed on the passivation layer and the organic insulation layer; but also the step of thickness is formed within the two layers at the same time, so that difference between the first cell gap of the first sub-pixel region and the second cell gap of the second sub-pixel region of the display panel can be adjusted within a larger range, and then the difference between the aperture opening ratio of the first sub-pixel region and the aperture opening ratio of the second sub-pixel region can be better compensated by adjusting the difference between the first cell gap of the first sub-pixel region and the second cell gap of the second sub-pixel region. In this example, other films or layers such as TFTs, pixel electrodes and common electrodes can be provided on the base substrate of the array substrate, which will not be described repeatedly herein.

On the basis of the above described structures of the display panel in the present embodiment, the embodiment also provides a method for producing such display panel. The method includes: forming a first sub-pixel region and a second sub-pixel region wherein an aperture opening ratio of the first sub-pixel region is less than that of the second sub-pixel region; forming a pattern of an insulation layer by one patterning process, wherein a first thickness of the insulation layer in the first sub-pixel region is less than a second thickness of the insulation layer in the second sub-pixel region so that a first cell gap of the display panel at the first sub-pixel region is larger than a second cell gap of the display panel at the second sub-pixel region, and the resulting aperture opening ratio of the first sub-pixel region and the aperture opening ratio of the second sub-pixel regions are consistent. In one example, the pattern of the insulation layer is formed by a half tone mask process.

In an example, when the insulation layer consists of one layer, for example when the insulation layer is a passivation layer, the method for producing the display panel further includes a step of forming a pattern of a passivation layer on the base substrate of the array substrate by using the patterning process, in which the pattern of the passivation layer is formed by a half tone mask process. The first thickness of the passivation layer in the first sub-pixel region is less than the second thickness of the passivation layer in the second sub-pixel region.

It should be noted that when the insulation layer consists of more than one layers, for example when the insulation consists of two layers, i.e., an organic insulation layer and a passivation layer, the method for producing the display panel further includes a step of forming a pattern of an organic insulation layer and a pattern of a passivation layer subsequently on the base substrate of the array substrate by using the patterning process, in which the pattern of the organic insulation layer and the pattern of the passivation layer are formed by a half tone mask process. The first thickness of the organic insulation layer and the passivation layer at the first sub-pixel region is less than the second thickness of the organic insulation layer and the passivation layer at the second sub-pixel region.

In the method for producing the display panel, the manufacturing of the insulation layer would not result in increase of the complexity of the process and the production cost, but with strong capability of implement. In this way, the manufacturing of the display panel would not cause increase of the complexity of the process and the production cost.

Figure 6:
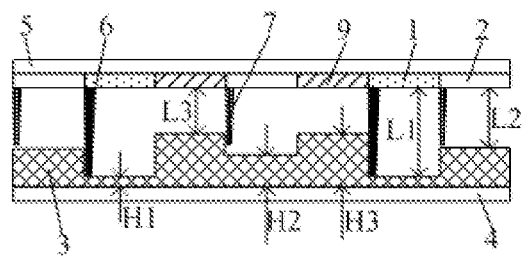
FIG. 6 is schematic cross sectional view for showing a structure of a display panel in accordance with a further embodiment of the present disclosure.
Figure 7:
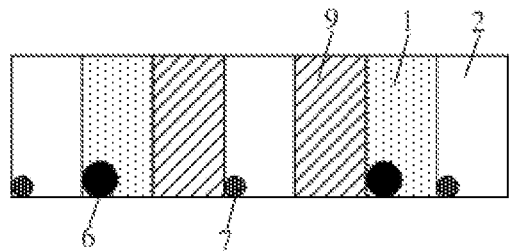
FIG. 7 is a schematic top view for showing distribution of main photo spacers and auxiliary spacers shown in FIG. 6 in a sub-pixel region.

A further embodiment of the present disclosure provides a display panel. The difference from those shown in the above embodiments, is as shown in FIGS. 6 and 7, on the basis of the display panel provided by the embodiments as shown in FIGS. 4 and 5, it further includes a third sub-pixel region 9 and the aperture opening ratio of the second sub-pixel region 2 is less than that of the third sub-pixel region 9. In a case that no photo spacer is provided at the third sub-pixel region 9, the second thickness H2 of the insulation layer 3 in the second sub-pixel region 2 is less than a third thickness H3 of the insulation layer 3 in the third sub-pixel region 9, so that the second cell gap L2 of the display panel at the second sub-pixel region 2 is larger than a third cell gap L3 of the display panel at the third sub-pixel region 9, and thus the difference between the aperture opening ratio of the second sub-pixel region 2 and the aperture opening ratio of the third sub-pixel region 9 is substantially or completely eliminated.

Please be noted that the above embodiment of the present disclosure takes one pixel unit including one first sub-pixel region, one second sub-pixel region and one third sub-pixel region as one example for illustration. Of course, the skilled person in the art can appropriately adapt and modify them on a basis of the concept of the present disclosure as required, for example, it is possible to adjust the first and/or second sub-pixel regions and/or the third sub-pixel region in one pixel unit so as to have the aperture opening ratio matching to that of the first and/or second sub-pixel regions and/or third sub-pixel region in another pixel unit. The present disclosure does not repeat them in detail herein.

The main photo spacer 6 occupies a portion of an area of the first sub-pixel region 1, the auxiliary photo spacer 7 occupies a portion of an area of the second sub-pixel region 2, and no photo spacers are provided in the third sub-pixel region 9, so the aperture opening ratio of the first sub-pixel region 1 is less than that of the second sub-pixel region 2, which in turn is less than the aperture opening ratio of the third sub-pixel region 9. The first thickness H1 of the insulation layer 3 in the first sub-pixel region 1 is provided to be less than the second thickness H2 of the insulation layer 3 in the second sub-pixel region 2, and the second thickness H2 of the insulation layer 3 in the second sub-pixel region 2 is provided to be less than the third thickness H3 of the insulation layer 3 in the third sub-pixel region 9, so that the first cell gap L1 of the display panel at the first sub-pixel region 1 is larger than the second cell gap L2 of the display panel at the second sub-pixel region 2, and the second cell gap L2 of the display panel at the second sub-pixel region 2 is larger than the third cell gap L3 of the display panel at the third sub-pixel region 9. And then, the liquid crystal light efficiency of the display panel at the first sub-pixel region 1 is larger than that of the display panel at the second sub-pixel region 2, and the liquid crystal light efficiency of the display panel at the second sub-pixel region 2 is larger than that of the display panel at the third sub-pixel region 9. In this way, a difference between the liquid crystal light efficiencies of the display panel at the first and second sub-pixel regions 1 and 2 can compensate the difference between the aperture opening ratio of the first sub-pixel region 1 and the aperture opening ratio of the second sub-pixel region 2, and further, a difference between the liquid crystal light efficiencies of the display panel at the second and third sub-pixel regions 2 and 9 can compensate the difference between the aperture opening ratio of the second sub-pixel region 2 and the aperture opening ratio of the third sub-pixel region 9, thereby improving difference of transitivity of lights passing through the first sub-pixel region 1, the second sub-pixel region 2 and the third sub-pixel region 9 of the display panel. Finally, it can enable the light transitivity of the display panel more uniform, alleviate the mura phenomena present when the display panel is displaying a picture, and improve the displaying effect of the picture.

The second cell gap at the second sub-pixel region 2 and the third cell gap at the third sub-pixel region 9 of the display panel are different from each other, so that the difference between the aperture opening ratio of the second sub-pixel region 2 and the aperture opening ratio of the third sub-pixel region 9 is at least partially compensated. In some embodiments, the difference between the aperture opening ratio of the second sub-pixel region 2 and the aperture opening ratio of the third sub-pixel region 9 can just be compensated by the difference between the second cell gap of the second sub-pixel region 2 and the third cell gap of the third sub-pixel region 9 (i.e., the difference between the aperture opening ratio of the second sub-pixel region 2 and the aperture opening ratio of the third sub-pixel region 9 is substantially or completely eliminated), so that the first sub-pixel region 1, the second sub-pixel region 2, and the third sub-pixel region 9 have the light transitivity to be consistent. Further, it can enable the light transitivity of the display panel more uniform, completely eliminate the mura phenomena present when the display panel is displaying a picture, and improve the displaying effect of the picture.

On the basis of the above described structures of the display panel in the present embodiment, the embodiment also provides a method for producing such display panel. Different from the method for producing the display panel of the embodiment as shown in FIGS. 2 and 3, on the basis of the method for producing the display panel of the embodiment as shown in FIGS. 2 and 3, the method further includes: forming a third sub-pixel region. An aperture opening ratio of the second sub-pixel region is less than that of the third sub-pixel region wherein a second thickness of the insulation layer in the second sub-pixel region is less than a third thickness of the insulation layer in the third sub-pixel region so that a cell gap of the display panel at the second sub-pixel region is larger than that of the display panel at the third sub-pixel region.

The other structures and other steps of the producing method for the display panel in accordance with the present embodiment are same to those in the embodiment as shown in FIGS. 2 and 3, they will not be repeated herein.

A yet further embodiment of the present disclosure provides a display panel, the difference of which from the embodiments as shown in FIGS. 2-5, is the main photo spacer and the auxiliary photo spacer are provided on the base substrate of the array substrate, while the insulation layer is provided the base substrate of the CF substrate.

Accordingly, the insulation layer is a planarization layer provided on the base substrate of the CF substrate.

Alternatively, the main photo spacer, the auxiliary photo spacer and the insulation layer all are provided on the base substrate of the array substrate.

In an alternative embodiment, the main photo spacer, the auxiliary photo spacer and the insulation layer all are provided on the base substrate of the CF substrate. Accordingly, the insulation layer is a planarization layer provided on the base substrate of the CF substrate.

The other structures and other steps of the producing method about the display panel in accordance with the present embodiment are same to those in the embodiments as described above, they are not repeated herein.

A yet another embodiment of the present disclosure provides a display panel, the difference of which from the embodiments as shown in FIGS. 2-3, is the photo spacer is provided on the base substrate of the array substrate, while the insulation layer is provided the base substrate of the CF substrate.

Accordingly, the insulation layer is a planarization layer provided on the base substrate of the CF substrate.

Alternatively, the photo spacer and the insulation layer both are provided on the base substrate of the array substrate.

In an alternative embodiment, the photo spacer and the insulation layer are provided on the base substrate of the CF substrate. Accordingly, the insulation layer is a planarization layer provided on the base substrate of the CF substrate.

The other structures and other steps of the producing method about the display panel in accordance with the present embodiment are same to those in the embodiments as shown in FIGS. 2-3, they will not be repeated herein.

With the display panels provided by the above embodiments, the first thickness of the insulation layer in the first sub-pixel region is provided to be less than the second thickness of the insulation layer in the second sub-pixel region, so that the first cell gap of the display panel at the first sub-pixel region is larger than the second cell gap of the display panel at the second sub-pixel region, and then the liquid crystal light efficiency of the display panel at the first sub-pixel region is larger than that of the display panel at the second sub-pixel region. In this way, a difference between the liquid crystal light efficiencies of the display panel at the first and second sub-pixel regions can compensate the difference between the aperture opening ratio of the first sub-pixel region and the aperture opening ratio of the second sub-pixel region, thereby improving difference of transitivity of lights passing through the first and second sub-pixel regions of the display panel. Finally, it can enable the light transitivity of the display panel more uniform, alleviate the mura phenomena present when the display panel is displaying a picture, and improve the displaying effect of the picture.

It should be noted that in the above respective embodiments, the difference among the first, second and third sub-pixel regions can be at least partially compensated by adjusting the first cell gap, the second cell gap and the third cell gap therein as required, but are not limited to the case that they just compensate the difference between the aperture opening ratios thereof.

A still yet embodiment of the present disclosure provides a display apparatus, including the display panel as described in any one of the above embodiments.

The display panels provided by the above embodiments alleviate the non-uniformity of light transitivity when the display apparatus is displaying a picture, and improve the displaying effect thereof.

The display apparatus provided by the present disclosure can be any product or components having the display function such as, liquid crystal panels, liquid crystal TVs, displays, mobile phones, navigators.

It should be understood that the above implementations are only intended to explain the principle of the present disclosure and to be illustrative, but the present disclosure is not limited to this. The skilled person in the art can make any modifications and variances without departing from the spirits and scope of the present disclosure, which shall be considered to be within the scope of the present disclosure.

What is claimed is:

1. A display panel, comprising:
  a first sub-pixel region;
  a second sub-pixel region, wherein an aperture opening ratio of the first sub-pixel region is less than an aperture opening ratio of the second sub-pixel region;
  an insulation layer, having a first thickness in the first sub-pixel region less than a second thickness of the insulation layer in the second sub-pixel region, so that a first cell gap of the display panel at the first sub-pixel region is larger than a second cell gap of the display panel at the second sub-pixel region, thereby at least partially compensating for a difference between the aperture opening ratio of the first sub-pixel region and the aperture opening ratio of the second sub-pixel region;
  a color filter layer; and
  a photo spacer provided within the first sub-pixel region, the photo spacer extending an entire thickness of a liquid crystal layer of the display panel,
  wherein there is no photo spacer in the second sub-pixel region,
  wherein the photo spacer and the insulation layer both are provided on a base substrate of an array substrate, and the photo spacer is directly disposed on the insulation layer,
  wherein the insulation layer is composed of an organic insulation layer and a passivation layer provided on a base substrate of an array substrate, and the organic insulation layer and the passivation layer are provided on the base substrate of the array substrate adjacent to a base substrate of a color filter substrate, and
  wherein the first cell gap of the first sub-pixel region and the second cell gap of the second sub-pixel region are configured such that a light transitivity of the second sub-pixel region is equal to that of the first sub-pixel region.

2. A display apparatus, comprising the display panel as claimed in claim 1.

3. A method for producing the display panel as claimed in claim 1, comprising:
  forming the first sub-pixel region and the second sub-pixel region, so that the aperture opening ratio of the first sub-pixel region is less than the aperture opening ratio of the second sub-pixel region;
  forming a pattern of the insulation layer by one patterning process, wherein the insulation layer has the first thickness in the first sub-pixel region less than the second thickness of the insulation layer in the second sub-pixel region, so that the first cell gap of the display panel at the first sub-pixel region is larger than the second cell gap of the display panel at the second sub-pixel region, thereby at least partially compensating for the difference between the aperture opening ratio of the first sub-pixel region and the aperture opening ratio of the second sub-pixel region.

4. A display panel, comprising:
  a first sub-pixel region;
  a second sub-pixel region, wherein an aperture opening ratio of the first sub-pixel region is less than an aperture opening ratio of the second sub-pixel region;
  a third sub-pixel region which has an aperture opening ratio larger than the aperture opening ratio of the second sub-pixel region;
  an insulation layer, having a first thickness in the first sub-pixel region less than a second thickness of the insulation layer in the second sub-pixel region, so that a first cell gap of the display panel at the first sub-pixel region is larger than a second cell gap of the display panel at the second sub-pixel region, thereby at least partially compensating for a difference between the aperture opening ratio of the first sub-pixel region and the aperture opening ratio of the second sub-pixel region;
  a color filter layer;
  a main photo spacer provided at the first sub-pixel region, the main photo spacer extending an entire thickness of a liquid crystal layer of the display panel; and
  an auxiliary photo spacer correspondingly provided at the second sub-pixel region;
  wherein an area which the main photo spacer occupies in the first sub-pixel region is larger than an area which the auxiliary photo spacer occupies in the second sub-pixel region,
  wherein there is no photo spacer in the third sub-pixel region, wherein the main photo spacer, the auxiliary photo spacer and the insulation layer both are provided on a base substrate of an array substrate, and the main photo spacer and the auxiliary photo spacer are directly disposed on the insulation layer, wherein the insulation layer is composed of an organic insulation layer and a passivation layer provided on a base substrate of an array substrate, and the organic insulation layer and the passivation layer are provided on the base substrate of the array substrate adjacent to a base substrate of a color filter substrate, wherein the second thickness of the insulation layer in the second sub-pixel region is less than a third thickness of the insulation layer in the third sub-pixel region, so that the second cell gap of the display panel at the second sub-pixel region is larger than a third cell gap of the display panel at the third sub-pixel region, thereby at least partially compensating for a difference between the aperture opening ratio of the second sub-pixel region and the aperture opening ratio of the third sub-pixel region, wherein the first cell gap of the first sub-pixel region and the second cell gap of the second sub-pixel region are configured such that a light transitivity of the second sub-pixel region is equal to that of the first sub-pixel region, and wherein the second cell gap of the second sub-pixel region and the third cell gap of the third sub-pixel region are configured such that a light transitivity of the third sub-pixel region is equal to that of the second sub-pixel region.

* * * * *